US011016001B2

(12) United States Patent
Farkas et al.

(10) Patent No.: US 11,016,001 B2
(45) Date of Patent: May 25, 2021

(54) SYSTEMS AND METHODS FOR LEAK DETECTION IN LIQUID-COOLED INFORMATION HANDLING SYSTEMS

(71) Applicant: Dell Products L.P., Round Rock, TX (US)

(72) Inventors: Sandor Farkas, Round Rock, TX (US); Jeremiah Bartlett, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 437 days.

(21) Appl. No.: 16/148,507

(22) Filed: Oct. 1, 2018

(65) Prior Publication Data
US 2020/0103307 A1    Apr. 2, 2020

(51) Int. Cl.
*G01M 3/40*   (2006.01)
*H05K 7/20*   (2006.01)
*G06F 1/20*   (2006.01)

(52) U.S. Cl.
CPC ............... *G01M 3/40* (2013.01); *G06F 1/20* (2013.01); *H05K 7/20218* (2013.01)

(58) Field of Classification Search
CPC ......... G01M 3/40; G06F 1/20; H05K 7/20218
USPC ..................................................... 73/40.5 R
See application file for complete search history.

(56) References Cited

U.S. PATENT DOCUMENTS

| | | | | |
|---|---|---|---|---|
| 3,981,181 A * | 9/1976 | Ochiai | ................. | G01M 3/045 73/40.5 R |
| 5,134,377 A * | 7/1992 | Reddy, III | ............ | G01M 3/165 324/533 |
| 5,159,276 A * | 10/1992 | Reddy, III | ............ | G01M 3/165 174/11 R |
| 5,235,286 A * | 8/1993 | Masia | ................. | G01M 3/165 174/11 R |
| 5,334,970 A * | 8/1994 | Bailey | ..................... | G01M 3/16 340/286.14 |
| 5,355,720 A * | 10/1994 | Bailey | ..................... | G01M 3/165 73/40 |
| 5,410,255 A * | 4/1995 | Bailey | ..................... | G01M 3/165 174/11 R |
| 8,786,451 B2 * | 7/2014 | Lee | ....................... | G01M 3/165 340/605 |
| 9,921,125 B2 * | 3/2018 | Osoinach | ................ | G01M 3/16 |
| 2018/0231430 A1 * | 8/2018 | Kim | ....................... | G08B 19/00 |

* cited by examiner

*Primary Examiner* — Nathaniel T Woodward
(74) *Attorney, Agent, or Firm* — Jackson Walker L.L.P.

(57) ABSTRACT

The method may include: in a first measurement phase, generating a first input signal to the first input terminal of a leak detection cable interface circuit and receiving a first response signal in response the first input signal; in a second measurement phase, generating a second input signal to the second input terminal of the leak detection cable interface circuit and receiving a second response signal in response the second input signal; and based on at least the first response signal and the second response signal, determining a state of a leak detection cable communicatively coupled to the leak detection cable interface circuit.

22 Claims, 4 Drawing Sheets

SYSTEMS AND METHODS FOR LEAK DETECTION IN LIQUID-COOLED INFORMATION HANDLING SYSTEMS

TECHNICAL FIELD

The present disclosure relates in general to information handling systems, and more particularly to leak detection in liquid-cooled information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

However, one disadvantage to using liquid cooling is that components of the liquid cooling system (e.g., fluid fittings, fluid joints, hoses or other fluidic conduits, pumps, cold plates, etc.) may develop leaks over time due to vibration, thermal cycles, or aging. Liquid leaks within an information handling system may cause corrosion to components of the information handling system and/or damage to electrical or electronic circuitry of the information handling system.

SUMMARY

In accordance with the teachings of the present disclosure, the disadvantages and problems associated with detecting leaks of fluid from active liquid cooling systems may be substantially reduced or eliminated.

In accordance with embodiments of the present disclosure, an information handling system may include an information handling resource, an active liquid cooling system for providing active cooling of the information handling resource, and a leak detection system for detecting a leak of fluid from the active liquid cooling system. The leak detection system may include a microcontroller configured to generate one or more control signals for leak detection by a leak detection cable and receive measurement signals indicative of a state of the leak detection cable in response to the one or more control signals and a leak detection cable interface circuit configured to interface between the leak detection cable and the microcontroller. The leak detection cable interface circuit may include two input terminals for interfacing with the microcontroller, two output terminals for interfacing with the leak detection cable, and a symmetrical network of passive circuit elements such that a first input impedance of a first input terminal of the two input terminals is approximately equal to a second input impedance of a second input terminal of the two input terminals and such that a first output impedance of a first output terminal of the two output terminals is approximately equal to a second output impedance of a second input terminal of the two output terminals.

In accordance with these and other embodiments of the present disclosure, a leak detection system may include a microcontroller configured to generate one or more control signals for leak detection by a leak detection cable and receive measurement signals indicative of a state of the leak detection cable in response to the one or more control signals and a leak detection cable interface circuit configured to interface between the leak detection cable and the microcontroller. The leak detection cable interface circuit may include two input terminals for interfacing with the microcontroller, two output terminals for interfacing with the leak detection cable, and a symmetrical network of passive circuit elements such that a first input impedance of a first input terminal of the two input terminals is approximately equal to a second input impedance of a second input terminal of the two input terminals and such that a first output impedance of a first output terminal of the two output terminals is approximately equal to a second output impedance of a second input terminal of the two output terminals.

In accordance with these and other embodiments of the present disclosure a method may be provided for use in a leak detection system for detecting for a leak of fluid, wherein the leak detection system comprises a leak detection cable interface circuit configured to interface with a leak detection cable and a microcontroller and comprising two input terminals for interfacing with the microcontroller, two output terminals for interfacing with the leak detection cable, and a symmetrical network of passive circuit elements such that a first input impedance of a first input terminal of the two input terminals is approximately equal to a second input impedance of a second input terminal of the two input terminals and such that a first output impedance of a first output terminal of the two output terminals is approximately equal to a second output impedance of a second input terminal of the two output terminals. The method may include: in a first measurement phase, generating a first input signal to the first input terminal and receiving a first response signal in response the first input signal; in a second measurement phase, generating a second input signal to the second input terminal and receiving a second response signal in response the second input signal; and based on at least the first response signal and the second response signal, determining a state of the leak detection cable.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
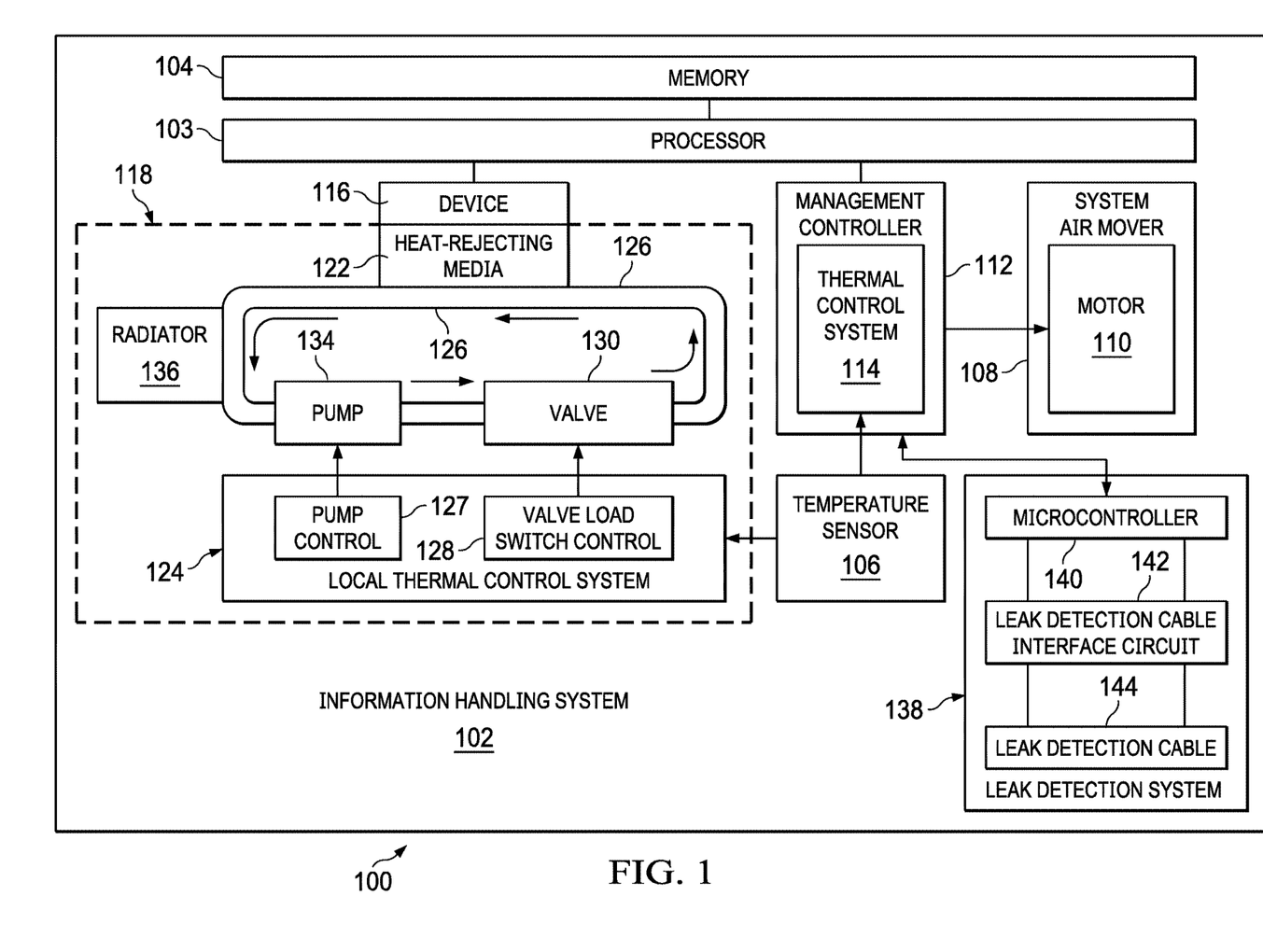
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, a system air mover 108, a management controller 112, a device 116, an active liquid cooling system 118, and a leak detection system 138.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

System air mover 108 may include any mechanical or electro-mechanical system, apparatus, or device operable to move air and/or other gases in order to cool information handling resources of information handling system 102. In some embodiments, system air mover 108 may comprise a fan (e.g., a rotating arrangement of vanes or blades which act on the air). In other embodiments, system air mover 108 may comprise a blower (e.g., a centrifugal fan that employs rotating impellers to accelerate air received at its intake and change the direction of the airflow). In these and other embodiments, rotating and other moving components of system air mover 108 may be driven by a motor 110. The rotational speed of motor 110 may be controlled by an air mover control signal communicated from thermal control system 114 of management controller 112. In operation, system air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to system air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirement information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

Oftentimes, an architecture of information handling system 102 may be such that device 116 may be significantly downstream of system air mover 108 that it may be significantly more effective for device 116 to be cooled using active liquid cooling system 118. As shown in FIG. 1, active liquid cooling system 118 may include a local thermal control system 124, heat-rejecting media 122, pump 134, radiator 136, valve 130, and fluidic conduits 126.

Local thermal control system 124 may be communicatively coupled to temperature sensor 106, and may include any system, device, or apparatus (e.g., a processor, controller, etc.) configured to control components of an active liquid cooling system for cooling a temperature of one or more information handling resources of information handling system 102. For example, local thermal control system 124 may be configured to control pump 134 and/or valve 130 based on thermal data sensed by temperature sensor 106, so as to maintain a safe operating temperature for one or more information handling resources. Accordingly, local thermal control system 124 may include a pump control subsystem 127 for controlling operation of pump 134 (e.g., a pressure applied to coolant fluid in fluidic conduits 126 for moving such fluid through fluidic conduits 126) and a valve load switch control subsystem 128 for controlling operation of valve 130 (e.g., opening or closing valve 130, controlling an aperture of valve 130, etc.).

Pump 134 may be fluidically coupled to one or more fluidic conduits 126 and may comprise any mechanical or electro-mechanical system, apparatus, or device operable to produce a flow of fluid (e.g., fluid in one or more conduits 126). For example, pump 134 may produce fluid flow by applying a pressure to fluid in fluidic conduits 126. As described above, operation of pump 134 may be controlled by pump control subsystem 127 which may control electro-mechanical components of pump 134 in order to produce a desired rate of coolant flow.

Radiator 136 may include any device, system or apparatus configured to transfer thermal energy from one medium (e.g., fluid within a fluidic conduit 126) to another (e.g., air external to chassis 100) for the purpose of cooling and heating. In some embodiments, radiator 136 may include fluidic channels and/or conduits in at least a portion of radiator 136. Such fluidic channels and/or conduits may be fluidically coupled to one or more of fluidic conduits 126 and pump 134.

Valve 130 may include any device, system or apparatus that regulates, directs, and/or controls the flow of a fluid (e.g., a coolant liquid in fluidic conduits 126) by opening, closing, or partially obstructing one or more passageways. When valve 130 is open, coolant liquid may flow in a direction from higher pressure to lower pressure. As described above, the operation of valve 130 (e.g., opening and closing, size of an aperture of valve 130) may be controlled by valve load switch control subsystem 128.

In operation, pump 134 may induce a flow of liquid (e.g., water, ethylene glycol, propylene glycol, or other coolant) through various fluidic conduits 126 of information handling system 102, valve 130 and/or radiator 136. As fluid passes by heat-rejecting media 122 in a fluidic conduit 126 proximate to device 116, heat may be transferred from device 116 to heat-rejecting media 122 and from heat-rejecting media 122 to the liquid coolant in fluidic conduit 126. As such heated coolant flows by radiator 136, heat from the coolant may be transferred from the coolant to air ambient to chassis 100, thus cooling the fluid.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, etc.) such that heat generated by the information handling resource is transferred from the information handling resource.

Leak detection system 138 may be communicatively coupled to management controller 112 and may comprise any system, device, or apparatus configured to detect a presence of a leak of the cooling fluid of active liquid cooling system 118, and generate one or more electrical signals indicative of whether such a leak is present. As shown in FIG. 1, leak detection system 138 may include a microcontroller 140, a leak detection cable interface circuit 142, and a leak detection cable 144. As described in greater detail below, microcontroller 140 may comprise any system, device, or apparatus configured to generate control signals for leak detection cable interface circuit 142 to determine the presence or absence of a leak of cooling fluid from active liquid cooling system 118, to receive one or more signals from leak detection cable interface circuit 142 indicative of the presence or absence of a leak of cooling fluid from active liquid cooling system 118, and to further communicate one or more signals to management controller 112 indicative of the presence or absence of a leak of cooling fluid from active liquid cooling system 118.

Also as described in greater detail below, leak detection cable interface circuit 142 may be communicatively coupled to microcontroller 140 and may comprise any system, device, or apparatus configured to receive control signals from microcontroller 140 and responsive to receipt of such control signals, generate one or more electrical signals indicative of the presence or absence of a leak of cooling fluid from active liquid cooling system 118.

Leak detection cable 144 may be communicatively coupled to leak detection cable interface circuit 142 and may comprise any system, device, or apparatus having an impedance (e.g., which may be modeled as an electrical resistance in parallel with an electrical capacitance) that may vary based on whether moisture is present on leak detection cable 144. For instance, in some embodiments, leak detection cable 144 may comprise a twisted pair cable having an electrical resistance that decreases in the presence of increased moisture present on leak detection cable 144 and increases in the presence of decreased moisture present on leak detection cable 144. In addition, as discussed elsewhere in this disclosure, leak detection cable 144 may have a capacitance. Detection of the existence of such capacitance may be an indicator of whether leak detection cable is present in leak detection system 138. For example, as discussed in greater detail below, a transient overshoot in response to a pulse driven on leak detection cable 144 may indicate presence of leak detection cable 144 and the lack of overshoot in response to an attempt to drive a pulse on leak detection cable 144 may indicate absence of leak detection cable 144 from leak detection system 138.

In addition to processor 103, memory 104, temperature sensor 106, air mover 108, management controller 112, device 116, active liquid cooling system 118, and leak detection system 138 information handling system 102 may include one or more other information handling resources. In addition, for the sake of clarity and exposition of the present disclosure, FIG. 1 depicts only one system air mover 108 and one device 116. In embodiments of the present disclosure, information handling system 102 may include any number of system air movers 108 and devices 116. Furthermore, for the sake of clarity and exposition of the present disclosure, FIG. 1 depicts device 116 including an active liquid cooling system 118 for active cooling of device 116. However, in some embodiments, approaches similar or identical to those used to actively cool device 116 as described herein may be employed to provide active cooling of processor 103, memory 104, management controller 112, and/or any other information handling resource of information handling system 102.

Figure 2:
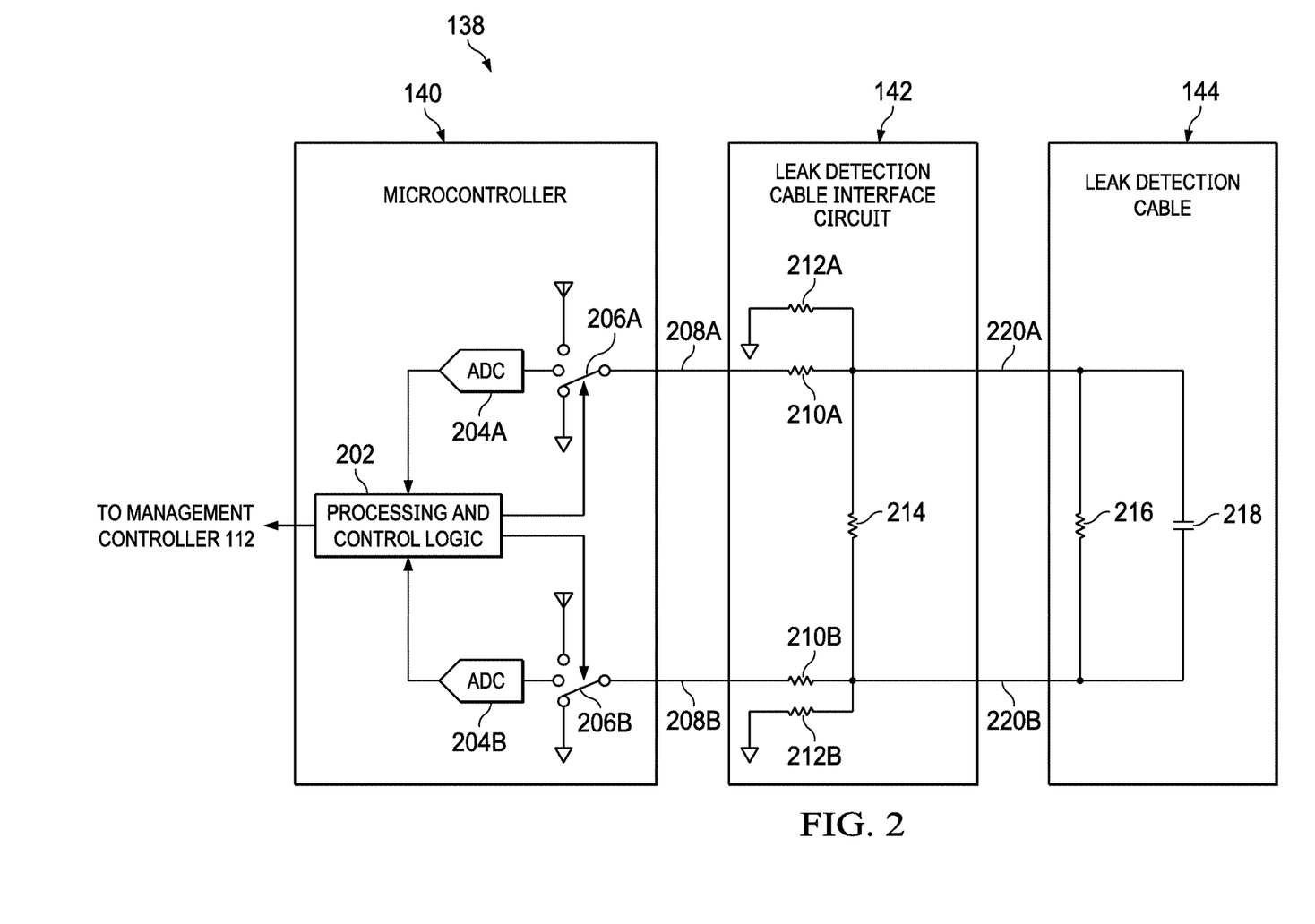
FIG. 2 illustrates a circuit diagram of a leak detection system, in accordance with embodiments of the present disclosure.

FIG. 2 illustrates an example circuit diagram of leak detection system 138, in accordance with embodiments of the present disclosure. As shown in FIG. 2, microcontroller 140 may comprise processing and control logic 202 communicatively coupled to management controller 112, two analog-to-digital converters (ADCs) 204A and 204B (which may be referred to individually as an ADC 204 and collectively as ADCs 204) communicatively coupled to processing and control logic 202, and two switches 206A and 206B (which may be referred to individually as a switch 206 and collectively as switches 206).

Processing and control logic 202 may comprise any system, device, or apparatus configured to generate control signals for switches 206, which in turn causes microcontroller 140 to generate control signals for leak detection cable interface circuit 142 to determine the presence or absence of a leak of cooling fluid from active liquid cooling system 118 and/or causes microcontroller 140 to receive one or more signals from leak detection cable interface circuit 142 indicative of the presence or absence of a leak of cooling fluid from active liquid cooling system 118. Processing and control logic 202 may also be configured to communicate one or more signals to management controller 112 indicative of the presence or absence of a leak of cooling fluid from active liquid cooling system 118.

An ADC 204 may comprise any suitable system, device, or apparatus configured to convert an analog signal (e.g., received from leak detection cable interface circuit 142) into an equivalent digital signal that may be processed by processing and control logic 202 to determine whether such digital signal is indicative of the presence or absence of a leak of cooling fluid from active liquid cooling system 118, as described in greater detail below.

A switch 206 may comprise any suitable system, device, or apparatus configured to open and/or close an electrical pathway under the control of a control signal. As shown in FIG. 2, a switch 206 may be controlled (e.g., by a control signal generated by processing and control logic 202) to selectively couple a corresponding electrical node 208A or 208B to one of a ground voltage, a source voltage, and an input of a corresponding ADC 204. Although FIG. 2 shows each switch 206 as a single-throw, triple-pole switch, the switching functionality of each switch 206 may be implemented in any suitable manner.

As shown in FIG. 2, leak detection cable interface circuit 142 may include two resistors 210A and 210B (which may be referred to individually as a resistor 210 and collectively as resistors 210), each of which may be coupled between an input (at an electrical node 208A or 208B) and a respective output (at an electrical node 220A or 220B) of leak detection cable interface circuit 142. Resistors 210A and 210B may be of approximately the same electrical resistance. Leak detection cable interface circuit 142 may also include a resistor 212A coupled between electrical node 220A and ground voltage and a resistor 212B coupled between electrical node 220B and ground voltage (resistors 212A and 212B may be referred to individually as a resistor 212 and collectively as resistors 212). Resistors 212A and 212B may be of approximately the same electrical resistance. Leak detection cable interface circuit 142 may further include a resistor 214 coupled between electrical nodes 220A and 220B. In operation, resistors 210 may protect microcontroller 140 from electrostatic discharge and/or a shorting of leak detection cable 144 to the supply voltage or the ground voltage. An example resistance for each resistor 210 may be approximately 10 Kiloohms. Furthermore, resistor 214 may ensure an input voltage to leak detection cable 144 is not zero unless shorted to the ground voltage. An example resistance for resistor 214 may be approximately 1 Megaohm. In addition, resistors 212 may form a voltage divider with leak detection cable 144 in order to perform leak detection operations as described below. An example resistance for each resistor 212 may be approximately 50 Kiloohms.

Thus, leak detection cable interface circuit 142 may be configured to interface between leak detection cable 144 and microcontroller 140 and may include two input terminals (e.g., at electrical nodes 208A and 208B) for interfacing with microcontroller 140, two output terminals (e.g., at electrical nodes 220A and 220B) for interfacing with leak detection cable 144, and a symmetrical network of passive circuit elements (e.g., resistors 210, 212, and 214) such that a first input impedance of a first input terminal of the two input terminals is approximately equal (e.g., within manufacturing tolerances) to a second input impedance of a second input terminal of the two input terminals and such that a first output impedance of a first output terminal of the two output terminals is approximately equal (e.g., within manufacturing tolerances) to a second output impedance of a second input terminal of the two output terminals.

As shown in FIG. 2, leak detection cable 144 may be modeled as an electrical resistance 216 in parallel with an electrical capacitance 218 such that when in operation, leak detection cable 144 is coupled between electrical nodes 220A and 220B such that electrical resistance 216 and electrical capacitance 218 are in parallel with resistor 214. As an example, in the presence of moisture, electrical resistance 216 may have a resistance between 1 and 10 Kiloohms and may have a resistance of several Megaohms in the absence of moisture.

Figure 3:
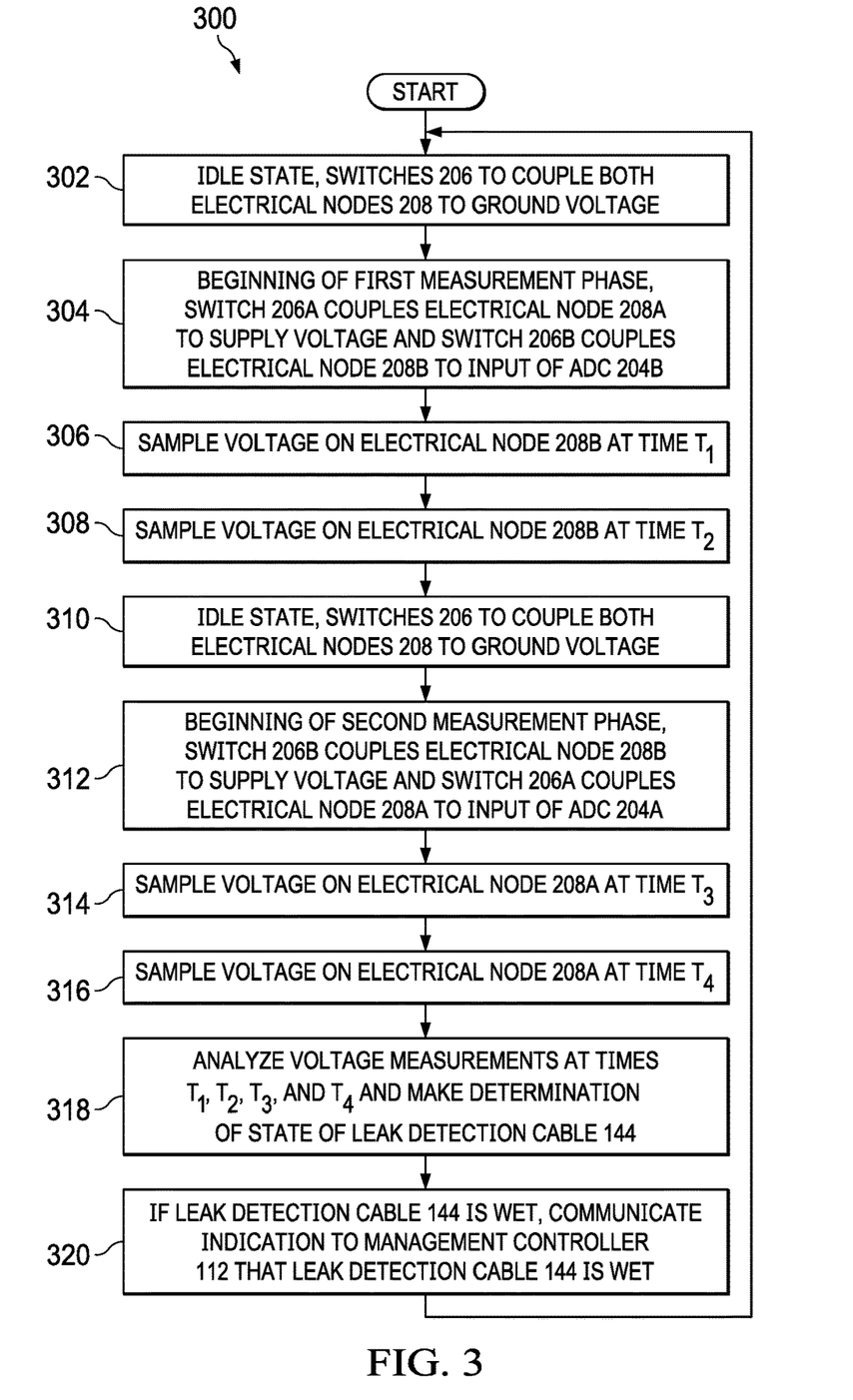
FIG. 3 illustrates a flow chart of an example method for leak detection in a liquid-cooled information handling system, in accordance with embodiments of the present disclosure.

FIG. 3 illustrates a flow chart of an example method 300 for leak detection in a liquid-cooled information handling system, in accordance with embodiments of the present disclosure. According to some embodiments, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen.

At step 302, a measurement cycle of leak detection system 138 may begin with leak detection system 138 in an idle state, wherein switches 206 are configured to couple both electrical nodes 208 to ground voltage, which is the state shown in FIG. 2.

Figure 4A:
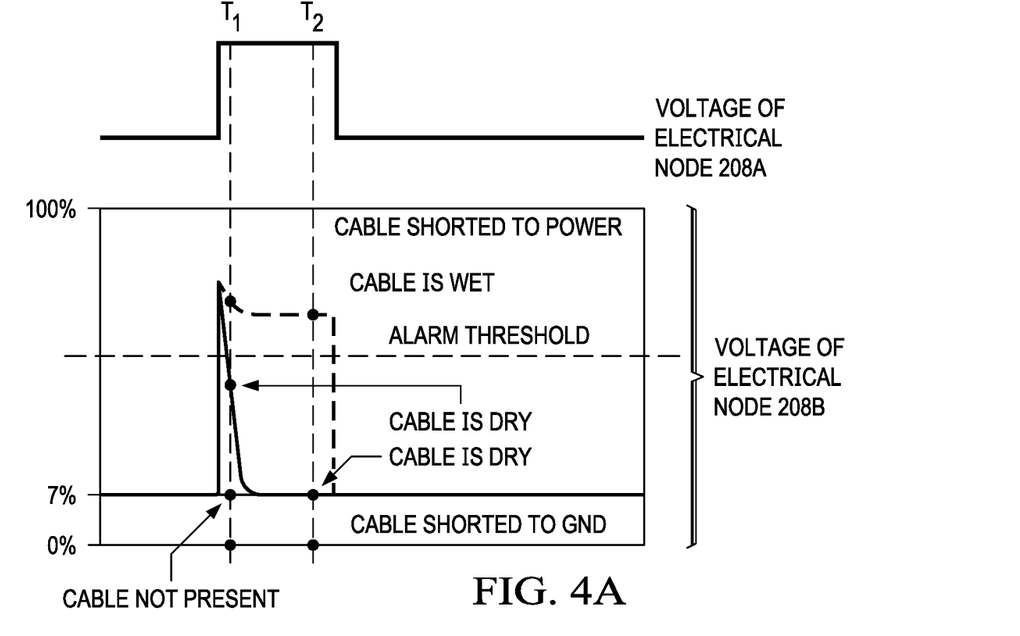
FIGS. 4A and 4B each illustrate a graph of example waveforms resulting from application of leak detection control signals to a leak detection cable interface circuit by a microcontroller, in accordance with embodiments of the present disclosure.

At step 304, processing and control logic 202 may control switch 206A to couple electrical node 208A to the supply voltage and control switch 206B to couple electrical node 208B to the input of ADC 204B, thus beginning a first measurement phase of leak detection system 138. FIG. 4A illustrates a graph of example waveforms resulting during such first measurement phase, in accordance with embodiments of the present disclosure. Accordingly, in the discussion of method 300 that follows, reference is made to the waveforms of FIG. 4A.

At step 306, shortly (e.g., a few microseconds) after the beginning of the first measurement phase at a time $t_1$ ADC 204B may sample a voltage present on electrical node 208B and convert such voltage into a digital representation of the sampled voltage, and processing and control logic 202 may receive the digital representation of the sampled voltage at time $t_1$. At the time $t_1$ of such sampling, the voltage present on electrical node 208B may be in a voltage overshoot region of a transient response to the instantaneous increase of the voltage at electrical node 208A from ground voltage to the supply voltage.

At step 308, at a later time $t_2$ after the transient overshoot decays, ADC 204B may sample a voltage present on electrical node 208B and convert such voltage into a digital representation of the sampled voltage, and processing and control logic 202 may receive the digital representation of the sampled voltage at time $t_2$.

At step 310, leak detection system 138 may again enter the idle state, wherein switches 206 are configured to couple both electrical nodes 208 to ground voltage, allowing leak detection cable 144 to be electrically reset.

Figure 4B:
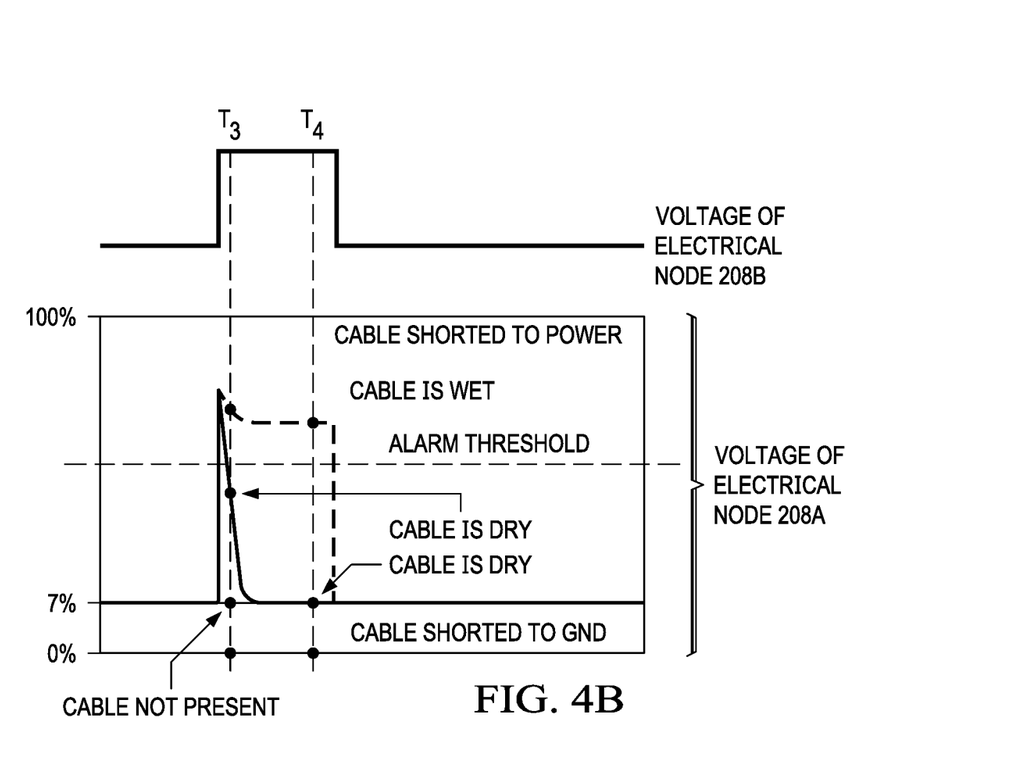

At step 312, processing and control logic 202 may control switch 206B to couple electrical node 208B to the supply voltage and control switch 206A to couple electrical node 208A to the input of ADC 204A, thus beginning a second measurement phase of leak detection system 138. FIG. 4B illustrates a graph of example waveforms resulting during such first measurement phase, in accordance with embodiments of the present disclosure. Accordingly, in the discussion of method 300 that follows, references is made to the waveforms of FIG. 4B.

At step 314, shortly (e.g., a few microseconds) after the beginning of the second measurement phase at a time $t_3$ ADC 204A may sample a voltage present on electrical node 208A and convert such voltage into a digital representation of the sampled voltage, and processing and control logic 202 may receive the digital representation of the sampled voltage at time $t_3$. At the time $t_3$ of such sampling, the voltage present on electrical node 208A may be in a voltage overshoot region of a transient response to the instantaneous increase of the voltage at electrical node 208B from ground voltage to the supply voltage.

At step 316, at a later time $t_4$ after the transient overshoot decays, ADC 204A may sample a voltage present on electrical node 208A and convert such voltage into a digital representation of the sampled voltage, and processing and control logic 202 may receive the digital representation of the sampled voltage at time $t_4$.

At step 318, processing and control logic 202 may analyze the voltage measurements at times $t_1$, $t_2$, $t_3$, and $t_4$ and make a determination of a state of leak detection cable 144 based on the voltage measurements. For example:

1) If all measurements at times $t_1$, $t_2$, $t_3$, and $t_4$ are near the ground voltage (e.g., less than 3% of the full scale voltage of the supply voltage), processing and control logic 202 may determine that leak detection cable 144 is shorted to the ground voltage;

2) If all measurements at times $t_1$, $t_2$, $t_3$, and $t_4$ are near the supply voltage (e.g., more than 97% of the full scale voltage of the supply voltage), processing and control logic 202 may determine that leak detection cable 144 is shorted to the supply voltage;

3) If measurements at times $t_1$ and $t_3$ are between 4% and 10% of the full scale of the supply voltage, processing and control logic 202 may determine that leak detection cable 144 is not present;

4) If measurements at times $t_1$ and $t_3$ are greater than 20% of the full scale of the supply voltage and measurements at times $t_2$ and $t_4$ are between 5% and 10% of the full scale of the supply voltage, processing and control logic 202 may determine that leak detection cable 144 is dry, thus indicating no leak of cooling fluid from leak detection system 138;

5) If measurements at all times $t_1$, $t_2$, $t_3$, and $t_4$ are greater than a threshold value (e.g., 25% of the full scale of the supply voltage) processing and control logic 202 may determine that leak detection cable 144 is wet, thus indicating a leak of cooling fluid from leak detection system 138; and 6) For all measurements, processing and control logic 202 may deem the measurement results invalid and discard the measurement results if none of the criteria in 1 through 5 above are not met.

At step 320, if processing and control logic 202 determines that leak detection cable 144 is wet, processing and control logic 202 may communicate an indication to management controller 112 that leak detection cable 144 is wet, in response to which management controller 112 may take appropriate remedial action (e.g., provide user alerts, power down all or a portion of the components of information handling system 102, etc.).

After completion of step 320, method 300 may proceed again to step 302.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using a host information handling system 102 and/or any other system operable to implement method 300. In certain embodiments, method 300 may be implemented partially or fully in software and/or firmware embodied in computer-readable media.

In addition to the foregoing, other optimizations may be made within leak detection system 138. For example, in some embodiments, averages of multiple samples at the times $t_1$, $t_2$, $t_3$, and/or $t_4$ may be employed to determine a state of leak detection cable 144. As another example, readings at times $t_2$ and $t_4$ may be compared and discarded if such readings are not within a threshold difference of each other. As a further example, for the various percentages described above with respect to method 300, windows of a certain magnitude may be added to the various thresholds to account for different types of leak detection cables and/or tolerances of leak detection cables.

As an additional example, instead of reading a fixed value of voltage at times $t_1$ and $t_3$, processing and control logic 202 may receive a burst of examples and determine the maximum value of the transient overshoot. Such an approach may enable supporting various cable types and lengths which may have different capacitances and thus different time constants.

Similarly, instead of reading a fixed value of voltage at times $t_2$ and $t_4$, processing and control logic 202 may sample the decay of the overshoot over multiple samples to indicate the times at which the overshoot has decayed to a threshold level. Such approach may allow for shortening of the pulses of the first measurement phase and second measurement phase, this minimizing power consumption associated with leak detection.

In these and other embodiments, the various thresholds can also be made adaptive. For example, thresholds may start at the beginning of the life cycle of information handling system 102 at particular values which may be adjusted based on long-term trends. As a specific example, the threshold ranges for a determination of a dry state for leak detection cable 144 may be adjusted to slowly track, over time, a long term average of the readings of times $t_2$ and $t_4$, to account for changes due to aging and/or temperature.

The methods and systems described above may provide many benefits and advantages compared to existing approaches. For example, the interface between microcontroller 140 and leak detection cable interface circuit 142 may require only two pins, while many existing approaches require three or more pins. As another example, leak detection system 138 may require only low-cost passive circuitry with simple digital processing running on a low-end microcontroller, and may be highly insensitive to process, temperature, and voltage corners, as well as noise. As a further example, as shown above, leak detection system 138 may be able to detect leak detection cable 144 being electrically shorted to either the supply voltage or ground voltage, detect broken elements (e.g., resistors) in leak detection system 138, and identify other hardware errors. As an additional example, the algorithm described above for identifying a state of leak detection cable 144 may be adaptive and thus may adjust its timing and relevant thresholds based on cable types and long-term trends.

In addition, leak detection system 138 can easily be made even more robust than described above by employing oversampling, averaging, filtering of outlier readings, defining invalid measurement ranges, and/or using long-term trends to avoid false alarms.

Further, due to the symmetrical pulsed operation between two measurement phases, leak detection cable 144 may be energized with a very low duty cycle wherein the average direct current on leak detection cable 144 is zero, which may reduce corrosion of cable wires.

Also, the signal drive created by leak detection system 138 on leak detection cable 144 may be a fairly "soft" drive such that leak detection system 138 does not cause significant electromagnetic interference and is also immune to electromagnetic interference from other components and immune from electrostatic discharge.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   an information handling resource;
   an active liquid cooling system for providing active cooling of the information handling resource; and
   a leak detection system for detecting a leak of fluid from the active liquid cooling system, the leak detection system comprising:
     a microcontroller configured to generate one or more control signals for leak detection by a leak detection cable and receive measurement signals indicative of a state of the leak detection cable in response to the one or more control signals; and
     a leak detection cable interface circuit configured to interface between the leak detection cable and the microcontroller and comprising:
       two input terminals for interfacing with the microcontroller;
       two output terminals for interfacing with the leak detection cable; and
       a symmetrical network of passive circuit elements such that a first input impedance of a first input terminal of the two input terminals is approximately equal to a second input impedance of a second input terminal of the two input terminals and such that a first output impedance of a first output terminal of the two output terminals is approximately equal to a second output impedance of a second input terminal of the two output terminals.

2. The information handling system of claim 1, wherein the symmetrical network of passive circuit elements comprises:
   a first resistor having a first resistance and coupled between the first input terminal and the first output terminal;
   a second resistor having a second resistance approximately equal to that of the first resistance and coupled between the second input terminal and the second output terminal;
   a third resistor having a third resistance and coupled between the first output terminal and a ground voltage;
   a fourth resistor having a fourth resistance approximately equal to that of the third resistance and coupled between the second output terminal and a ground voltage; and
   a fifth resistor coupled between the first output terminal and the second output terminal.

3. The information handling system of claim 1, wherein the microcontroller is configured to:
   in a first measurement phase, generate a first input signal to the first input terminal and receive a first response signal in response to the first input signal;
   in a second measurement phase, generate a second input signal to the second input terminal and receive a second response signal in response to the second input signal; and
   based on at least the first response signal and the second response signal, determine a state of the leak detection cable.

4. The information handling system of claim 3, wherein:
   the first input signal is a first pulsed signal;
   the first response signal is a transient response of the leak detection cable interface circuit and the leak detection cable to the first pulsed signal;
   the second input signal is a second pulsed signal; and
   the second response signal is a transient response of the leak detection cable interface circuit and the leak detection cable to the second pulsed signal.

5. The information handling system of claim 3, wherein the microcontroller is further configured to:
   in a first idle phase before the first measurement phase and after the second measurement phase, reset the leak detection cable interface circuit and the leak detection cable; and
   in a second idle phase before the second measurement phase and after the first measurement phase, reset the leak detection cable interface circuit and the leak detection cable.

6. The information handling system of claim 5, wherein resetting the leak detection cable interface circuit and the leak detection cable comprises forcing both of the first input terminal and the second input terminal to a ground voltage.

7. The information handling system of claim 1, wherein the state of the leak detection cable may comprise one of a state in which moisture is present on the leak detection cable and a state in which moisture is absent from the leak detection cable.

8. The information handling system of claim 6, wherein the state of the leak detection cable may further comprise a state in which the leak detection cable is absent, a state in which the leak detection cable is electrically shorted to a ground voltage, and a state in which the leak detection cable is electrically shorted to a supply voltage.

9. A leak detection system for detecting a leak of fluid, the leak detection system comprising:
  a microcontroller configured to generate one or more control signals for leak detection by a leak detection cable and receive measurement signals indicative of a state of the leak detection cable in response to the one or more control signals; and
  a leak detection cable interface circuit configured to interface between the leak detection cable and the microcontroller and comprising:
    two input terminals for interfacing with the microcontroller;
    two output terminals for interfacing with the leak detection cable; and
    a symmetrical network of passive circuit elements such that a first input impedance of a first input terminal of the two input terminals is approximately equal to a second input impedance of a second input terminal of the two input terminals and such that a first output impedance of a first output terminal of the two output terminals is approximately equal to a second output impedance of a second input terminal of the two output terminals.

10. The leak detection system of claim 9, wherein the symmetrical network of passive circuit elements comprises:
  a first resistor having a first resistance and coupled between the first input terminal and the first output terminal;
  a second resistor having a second resistance approximately equal to that of the first resistance and coupled between the second input terminal and the second output terminal;
  a third resistor having a third resistance and coupled between the first output terminal and a ground voltage;
  a fourth resistor having a fourth resistance approximately equal to that of the third resistance and coupled between the second output terminal and a ground voltage; and
  a fifth resistor coupled between the first output terminal and the second output terminal.

11. The leak detection system of claim 9, wherein the microcontroller is configured to:
  in a first measurement phase, generate a first input signal to the first input terminal and receive a first response signal in response to the first input signal;
  in a second measurement phase, generate a second input signal to the second input terminal and receive a second response signal in response to the second input signal; and
  based on at least the first response signal and the second response signal, determine the state of the leak detection cable.

12. The leak detection system of claim 11, wherein:
  the first input signal is a first pulsed signal;
  the first response signal is a transient response of the leak detection cable interface circuit and the leak detection cable to the first pulsed signal;
  the second input signal is a second pulsed signal; and
  the second response signal is a transient response of the leak detection cable interface circuit and the leak detection cable to the second pulsed signal.

13. The leak detection system of claim 11, wherein the microcontroller is further configured to:
  in a first idle phase before the first measurement phase and after the second measurement phase, reset the leak detection cable interface circuit and the leak detection cable; and
  in a second idle phase before the second measurement phase and after the first measurement phase, reset the leak detection cable interface circuit and the leak detection cable.

14. The leak detection system of claim 13, wherein resetting the leak detection cable interface circuit and the leak detection cable comprises forcing both of the first input terminal and the second input terminal to a ground voltage.

15. The leak detection system of claim 9, wherein the state of the leak detection cable may comprise one of a state in which moisture is present on the leak detection cable and a state in which moisture is absent from the leak detection cable.

16. The leak detection system of claim 15, wherein the state of the leak detection cable may further comprise a state in which the leak detection cable is absent, a state in which the leak detection cable is electrically shorted to a ground voltage, and a state in which the leak detection cable is electrically shorted to a supply voltage.

17. A method, in a leak detection system for detecting for a leak of fluid, wherein the leak detection system comprises a leak detection cable interface circuit configured to interface with a leak detection cable and a microcontroller and comprising two input terminals for interfacing with the microcontroller, two output terminals for interfacing with the leak detection cable, and a symmetrical network of passive circuit elements such that a first input impedance of a first input terminal of the two input terminals is approximately equal to a second input impedance of a second input terminal of the two input terminals and such that a first output impedance of a first output terminal of the two output terminals is approximately equal to a second output impedance of a second input terminal of the two output terminals, the method comprising:
  in a first measurement phase, generating a first input signal to the first input terminal and receiving a first response signal in response the first input signal;
  in a second measurement phase, generating a second input signal to the second input terminal and receiving a second response signal in response the second input signal; and
  based on at least the first response signal and the second response signal, determining a state of the leak detection cable.

18. The method of claim 17, wherein:
  the first input signal is a first pulsed signal;
  the first response signal is a transient response of the leak detection cable interface circuit and the leak detection cable to the first pulsed signal;
  the second input signal is a second pulsed signal; and the second response signal is a transient response of the leak detection cable interface circuit and the leak detection cable to the second pulsed signal.

19. The method of claim 18, further comprising:
in a first idle phase before the first measurement phase and after the second measurement phase, resetting the leak detection cable interface circuit and the leak detection cable; and
in a second idle phase before the second measurement phase and after the first measurement phase, resetting the leak detection cable interface circuit and the leak detection cable.

20. The method of claim 19, wherein resetting the leak detection cable interface circuit and the leak detection cable comprises forcing both of the first input terminal and the second input terminal to a ground voltage.

21. The method of claim 17, wherein the state of the leak detection cable may comprise one of a state in which moisture is present on the leak detection cable and a state in which moisture is absent from the leak detection cable.

22. The method of claim 21, wherein the state of the leak detection cable may further comprise a state in which the leak detection cable is absent, a state in which the leak detection cable is electrically shorted to a ground voltage, and a state in which the leak detection cable is electrically shorted to a supply voltage.

* * * * *